US011363715B2

(12) United States Patent
Minato et al.

(10) Patent No.: US 11,363,715 B2
(45) Date of Patent: Jun. 14, 2022

(54) LIGHTING DEVICE WITH INTERMEDIATE CONTACTS AND METHOD OF MANUFACTURING THE SAME

(71) Applicant: NICHIA CORPORATION, Anan (JP)

(72) Inventors: Eiko Minato, Anan (JP); Yumiko Kameshima, Anan (JP); Koji Taguchi, Anan (JP); Masaaki Katsumata, Anan (JP)

(73) Assignee: NICHIA CORPORATION, Anan (JP)

( * ) Notice: Subject to any disclaimer, the term of this patent is extended or adjusted under 35 U.S.C. 154(b) by 260 days.

(21) Appl. No.: 16/583,270

(22) Filed: Sep. 26, 2019

(65) Prior Publication Data

US 2020/0107442 A1   Apr. 2, 2020

(30) Foreign Application Priority Data

Sep. 27, 2018   (JP) .............................. JP2018-182315

(51) Int. Cl.
*H05K 1/11*   (2006.01)
*H05K 3/32*   (2006.01)
*H05K 1/02*   (2006.01)

(52) U.S. Cl.
CPC ........... *H05K 1/115* (2013.01); *H05K 1/0296* (2013.01); *H05K 3/321* (2013.01); *H05K 2201/10106* (2013.01)

(58) Field of Classification Search
CPC ...... H05K 1/115; H05K 1/0296; H05K 3/321; H05K 2201/10106
USPC ........................................................ 438/34
See application file for complete search history.

(56) References Cited

U.S. PATENT DOCUMENTS

| 2015/0369467 | A1* | 12/2015 | Saito | H05K 3/0011 |
| | | | | 362/345 |
| 2016/0276630 | A1* | 9/2016 | Farrnbacher | H01L 51/5203 |
| 2017/0019996 | A1* | 1/2017 | Watanabe | H01L 23/60 |
| 2018/0239193 | A1 | 8/2018 | Hayashi | |
| 2018/0358521 | A1* | 12/2018 | Marutani | H01L 33/508 |
| 2019/0029116 | A1* | 1/2019 | Carel | H01L 33/508 |

(Continued)

FOREIGN PATENT DOCUMENTS

| JP | 04-002195 | 1/1992 |
| JP | 10-079575 | 3/1998 |
| JP | 2000-106478 | 4/2000 |

(Continued)

*Primary Examiner* — Allen L Parker
(74) *Attorney, Agent, or Firm* — Mori & Ward, LLP

(57) ABSTRACT

A lighting device including a light-emitter including light emitting elements, and a support having a first surface that carries a wiring line electrically connecting element electrodes of the light emitting elements and a light emitting surface, and a substrate including a base substrate, a conductor formed on a first surface of the base substrate, an adhesive member formed on a second surface of the base substrate, and a through-hole penetrating the substrate. A space is formed between the substrate and the light-emitter to communicate with a bottomed hole formed in a location of the through-hole as a result of adhering an adhesive surface of the adhesive member to a surface of the light-emitter having the wiring line formed thereon. The wiring line is connected to the conductor via a filler filling the bottomed hole, and the space is located outside an opening of the bottomed hole.

6 Claims, 10 Drawing Sheets

(56) References Cited

U.S. PATENT DOCUMENTS

2019/0074266 A1* 3/2019 Andrews ............... H05K 1/181
                                                        362/235
2021/0080786 A1  3/2021 Hayashi

FOREIGN PATENT DOCUMENTS

| JP | 2000-349422 | 12/2000 |
| JP | 2005-183548 | 7/2005 |
| JP | 2010-087429 | 4/2010 |
| JP | 2013-102201 | 5/2013 |
| JP | 2013-251434 | 12/2013 |
| JP | 2018-133304 | 8/2018 |

* cited by examiner

LIGHTING DEVICE WITH INTERMEDIATE CONTACTS AND METHOD OF MANUFACTURING THE SAME

CROSS-REFERENCE TO RELATED APPLICATIONS

The present application claims priority under 35 U.S.C. § 119 to Japanese Patent Application No. 2018-182315, filed Sep. 27, 2018, the contents of which are hereby incorporated by reference in their entirety.

BACKGROUND

Field of the Invention

The present disclosure relates to a lighting device and a method of manufacturing the lighting device.

Description of the Related Art

See, for example, Japanese Unexamined Patent Application Publication No. 2013-102201.

SUMMARY OF THE INVENTION

A method of manufacturing a lighting device is advantageously provided that includes preparing a plane light-emitter including a plurality of light emitting elements, and a support having a first surface that carries a wiring line electrically connecting element electrodes of the plurality of light emitting elements and a second surface that serves as a light emitting surface. The method further includes preparing a substrate including a base substrate having a film shape, a conductor formed on a part of a first surface of the base substrate, an adhesive member formed on a second surface of the base substrate, and a through-hole penetrating the substrate in a thickness direction of the substrate. The method also includes forming an intermediate structure having a space between the substrate and the plane light-emitter, the space being forming in such a way as to communicate with a bottomed hole formed in a location of the through-hole as a result of adhering an adhesive surface of the adhesive member of the substrate to a surface of the plane light-emitter having the wiring line formed thereon. And, the method includes connecting the wiring line to the conductor via a filler on the intermediate structure, the filler being formed by injecting an electrically conductive paste into the bottomed hole and curing the electrically conductive paste. The space of the intermediate structure is located outside an opening of the bottomed hole in a plan view.

A lighting device is advantageously provided that includes a plane light-emitter including a plurality of light emitting elements, and a support having a first surface that carries a wiring line electrically connecting element electrodes of the plurality of light emitting elements and a second surface that serves as a light emitting surface. The lighting device further includes a substrate including a base substrate having a film shape, a conductor formed on a part of a first surface of the base substrate, an adhesive member formed on a second surface of the base substrate, and a through-hole penetrating the substrate in a thickness direction the substrate. A space is formed between the substrate and the plane light-emitter in such a way as to communicate with a bottomed hole formed in a location of the through-hole as a result of adhering an adhesive surface of the adhesive member of the substrate to a surface of the plane light-emitter having the wiring line formed thereon. The wiring line is connected to the conductor via a filler filling the bottomed hole, and the space is located outside an opening of the bottomed hole in a plan view.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

DESCRIPTION OF THE EMBODIMENTS

Figure 1:
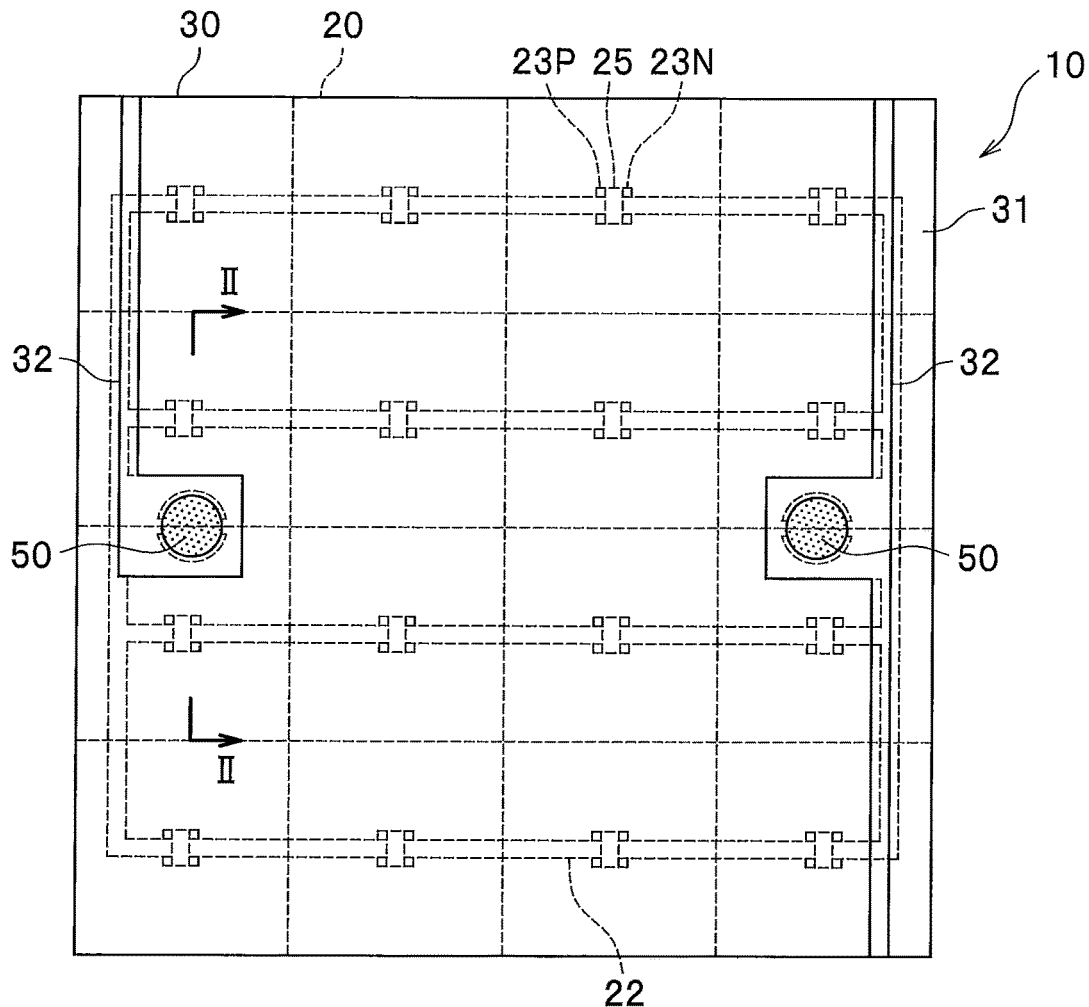
FIG. 1 is a schematic plan view diagrammatically illustrating a lighting device according to a first embodiment.

Embodiments of a lighting device according to the present invention will now be described with reference to the drawings.

The drawings that will be referred to in the following description schematically illustrate the present invention. Members shown in the drawings may be depicted exaggeratedly in their scales, intervals, positional relationships, and the like, and some of those members may be omitted from the drawings. In some cases, members depicted in plan views and those depicted in cross-sectional views may not match in their scales and intervals. In the following description, in principle, the same names and reference marks represent the same members or members substantially the same in configuration. Detailed description of such members will be omitted when necessary. In defining the positional relationship of lighting devices according to embodiments of the present invention, "upper side," "lower side," "left," and "right" may be replaced with each other depending on situations. In this specification, "upper side," "lower side," and the like indicate the relative positions of constituent elements in drawings, which are referred to for better description, and, unless otherwise specified, do not indicate the absolute positions of the same.

First Embodiment

Figure 2:
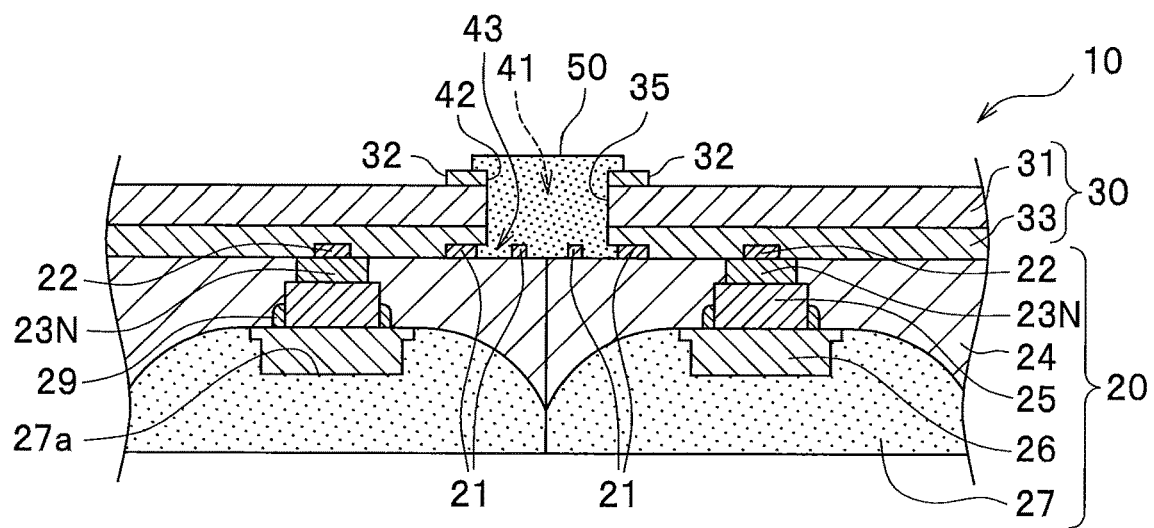
FIG. 2 is a cross-sectional view of the lighting device of FIG. 1 that is taken along line II-II.
Figure 3:
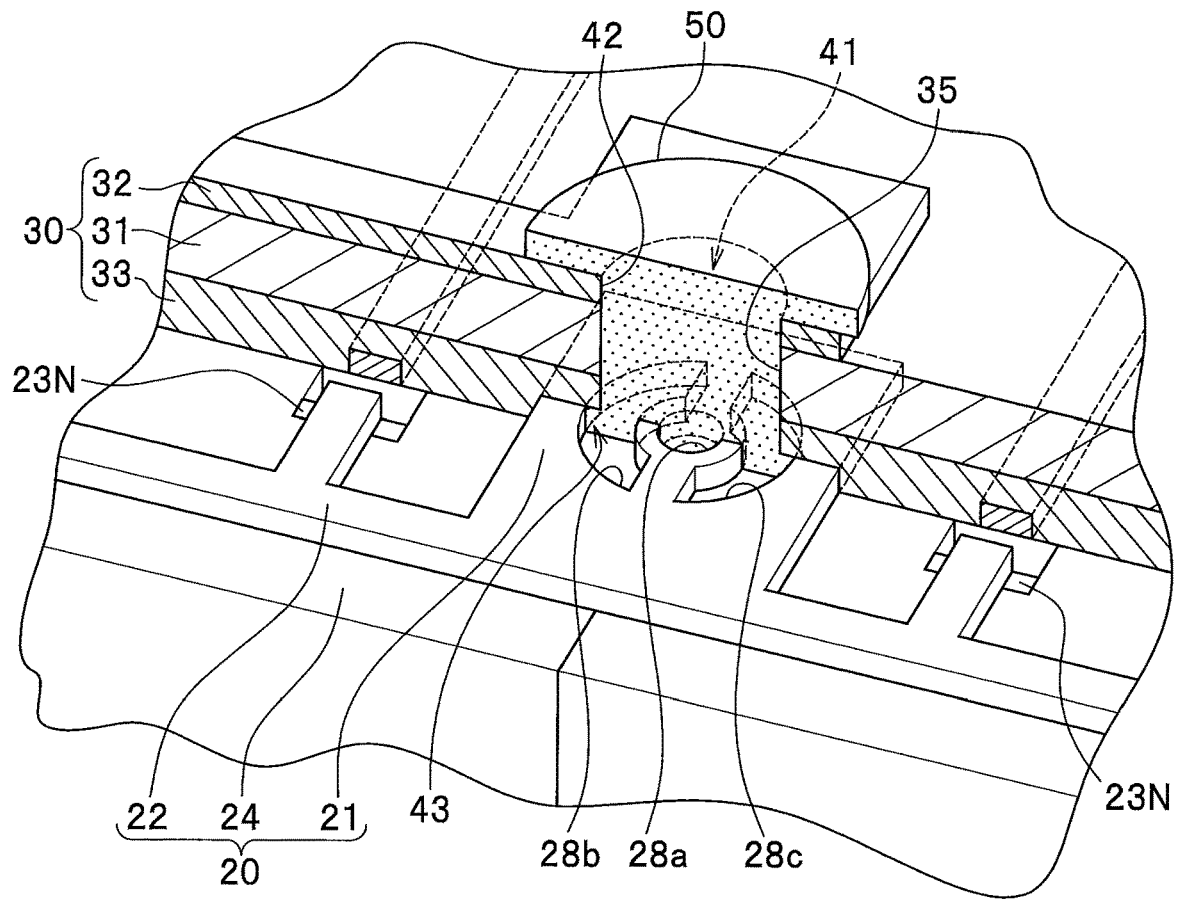
FIG. 3 is a schematic explanatory perspective view of a part where a filler is injected in the lighting device according to the first embodiment.

FIG. 1 is a schematic plan view diagrammatically illustrating a lighting device according to a first embodiment. FIG. 2 is a cross-sectional view of the lighting device of FIG. 1 that is taken along line II-II. FIG. 3 is a schematic explanatory perspective view of a part where a filler is injected in the lighting device according to the first embodiment. FIG. 1 illustrates a substrate surface opposite to a light emitting surface of a lighting device 10.
Configuration of Lighting Device The lighting device 10 includes a plane light-emitter 20 and a substrate 30 having through-holes.

The plane light-emitter 20 has a plurality of light emitting elements 25 and a support 24 that supports the light emitting elements 25. The support 24 has an upper surface carrying one or more wiring lines 22, and a lower surface serving as a light emitting surface. The wiring lines 22 electrically connect element electrodes 23N and 23P of the plurality of light emitting elements 25.

The substrate 30 has a film-like base substrate 31, conductors 32, and an adhesive member 33. The conductors 32 are formed on a part of an upper surface of the base substrate 31. The adhesive member 33 is formed on a lower surface of the base substrate 31. The substrate 30 has through-holes 35 penetrating the substrate 30 in its thickness direction.

The lighting device 10 is constructed by adhering an adhesive surface of the adhesive member 33 of the substrate 30 to a surface of the plane light-emitter 20 on which the wiring lines 22 are formed. As a result, the lighting device 10 has spaces 43 formed between the substrate 30 and the plane light-emitter 20 in such a way as to communicate with bottomed holes 41 formed in the location of the through-holes 35. Bottomed holes 41 are filled with an electrically conductive paste, which cures to form a filler 50. This filler 50 connects the wiring line(s) 22 to the conductors 32. Each space 43 is located outside an opening 42 of the bottomed hole 41 in a plan view (see FIGS. 2 and 3). In FIG. 3, the substrate 30 is broken to expose a part of the plane light-emitter 20, where the vicinity of a terminal 21 connected to the wiring line 22 is diagrammatically illustrated.

Constituent elements of the lighting device 10 will be described in detail in order.

The wiring line 22 is patterned into a given shape on an upper surface of the light emitting element 25 and the upper surface of the support 24. The wiring line 22 is a wiring line through which external power is supplied to the light emitting element 25. As the wiring line 22, an ordinary wiring line incorporated in a package substrate of a light-emitting device can be used. A metal material can be used as a material making up such a wiring line. For example, a simple substance metal, such as Ag, Al, Ni, Rh, Au, Cu, Ti, Pt, Pd, Mo, Cr, and W, or an alloy containing any one of these metals can be used preferably as the material of the wiring line. More preferably, a simple substance metal with high light reflectance, such as Ag, Al, Pt, and Rh, or alloy containing any one of these metals can be used. The wiring line 22 can be obtained also by printing and curing the electrically conductive paste.

The wiring line 22 is electrically connected to the terminals 21. In a plan view, each terminal 21 is configured to have recess portions, i.e., a first recess portion 28a, a second recess portion 28b, and a third recess portion 28c. Of these recess portions, the second recess portion 28b and the third recess portion 28c have the space 43 extending to a location outside the opening 42 of the bottomed hole 41 in a plan view.

The first recess portion 28a is formed into a circular shape between the second recess portion 28b and the third recess portion 28c in a plan view. The second recess portion 28b and the third recess portion 28c are formed into, for example, semi-circular shapes along the circumference of the first recess portion 28a in a plan view (see FIGS. 3 and 13A). When the opening 42 of the bottomed hole 41 is 500 μm to 600 μm in diameter, the second recess portion 28b and the third recess portion 28c are each 200 μm to 300 μm in width. The second recess portion 28b and the third recess portion 28c, which have the space 43, can be, for example, rectangular in a plan view. One or a plurality of such recess portions having the space 43 are provided.

The first recess portion 28a, the second recess portion 28b, and the third recess portion 28c are, for example, each 5 μm to 30 μm in depth. Respective bottom surfaces of the first recess portion 28a, the second recess portion 28b, and the third recess portion 28c are formed of a part of the upper surface of the support 24. The height from the upper surface of the support 24 to an upper surface of a lead of the terminal 21 is, for example, 0.1 μm to 30 μm. The wiring line 22 is connected to an external power supply via the terminal 21, the filler 50, and the conductor 32.

Each light emitting element 25 has a semiconductor layer formed on a light-transmissive element substrate, such as sapphire. The semiconductor layer is composed of an n-side semiconductor layer, an active region, and a p-side semiconductor layer that are stacked in increasing order from the element substrate side. As the light emitting element 25 capable of emitting UV-rays and visible light ranging from blue light to green light, for example, a GaN-based element or a InGaN-based element, which is exemplified by a nitride semiconductor $In_XAl_YGa_{1-X-Y}N (0 \leq X \leq 1, 0 \leq Y \leq 1, X+Y \leq 1)$, can be used. The light emitting element 25 can dispense with the element substrate. The light emitting element 25 is, for example, rectangular in a plan view. It can be, however, circular, elliptical, triangular, or polygonal, such as hexagonal. It is preferable that the light emitting element 25 have negative and positive element electrodes 23N and 23P disposed on the same surface.

The plurality of light emitting elements 25 are, for example, electrically connected in series and in parallel to each other. The plane light-emitter 20 carries, for example, sixteen light emitting elements 25 arranged into a four by four matrix. These sixteen light emitting elements 25 are, for example, configured into a 4-parallel/4-series circuit and are electrically connected to each other. The plurality of light emitting elements 25 can be put in wiring arrangement in which each light emitting element 25 is driven independently. An interval between light emitting elements 25 adjacent to each other is, for example, about 3 mm to 10 mm.

The support 24 is a member that supports the light emitting elements 25 and other elements. The support 24 covers an upper surface of a light guide member 27 and side surfaces of the light emitting elements 25 and side surfaces of light-transmissive members 26. It is preferable that the support 24 be made of a material with high light reflectance. It is preferable that the light reflectance of the support 24 for light with an emission peak wavelength from the light emitting element 25 be 70% or higher, more preferably, be 80% or higher, and, further preferably, be 90% or higher. For example, a resin material containing a light reflective substance can be used as the support 24. Such light reflective substances include titanium oxide, silicon oxide, zirconium oxide, potassium titanate, aluminum oxide, aluminum nitride, boron nitride, zinc oxide, calcium carbonate, barium sulfate, and mullite. It is preferable that the resin material have a resin-based base material made mainly of a thermosetting resin, such as epoxy resin, silicone resin, silicone modified resin, and phenol resin. To improve its light reflectance, the support 24 can be designed to have dotted shapes or a shape similar to a Fresnel lens.

The plane light-emitter 20 further has the light-transmissive members 26, the light guide member 27, and bonding members 29.

Each light-transmissive member 26 is disposed in such a way as to cover a lower surface of the light emitting element 25, the lower surface serving as a light-extracting surface. The light-transmissive member 26 is a light-transmissive member containing a fluorescent material. Examples of the fluorescent material making up the light-transmissive member 26 include a yttrium-aluminum-oxide-based fluorescent material (YAG-based fluorescent material), $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, and $Y_{2.90}Ce_{0.05}Pr_{0.05}Al_5O_{12}$. A package in which the light emitting elements 25, the support 24, and the light-transmissive members 26 are integrated together can be used.

A light-transmissive resin material, glass, or the like can be used as a material making up the light-transmissive member 26. For example, a thermosetting resin, such as silicone resin, silicone modified resin, epoxy resin, and phenol resin, can be used as the above material. A thermoplastic resin, such as polycarbonate resin, acrylic resin, methyl pentene resin, and polynorbornene resin, can also be used as the above material. A silicone resin having superior light resistance and heat resistance is particularly preferable as such a material. It is preferable that, for light from a light-emitting diode, the light-transmissive member 26 show light transmissivity of 70% or higher, and more preferably, light transmissivity of 80% or higher.

The light guide member 27 is a light-transmissive member which receives incoming light from a light source and emits light spreading along a plane. The light guide member 27 has a lower surface, which is a first main surface, and an upper surface opposite to the first surface, the upper surface being a second main surface. The first main surface of the light guide member 27 serves as a light emitting surface. The light guide member 27 can be given a plane shape of, for example, a substantially rectangular shape or substantially circular shape. The light guide member 27 has a plurality of fourth recess portions 27a formed on its upper surface serving as the second main surface, the fourth recess portions 27a being recess portions in which the light-transmissive members 26 are placed respectively. The light-transmissive member 26 is placed in each fourth recess portion 27a, where the light emitting element 25 is bonded to an upper surface of the light-transmissive member 26. The first main surface of the light guide member 27 can be formed into a flat surface or can be provided with irregularities, lens shapes, or the like. On the first main surface of the light guide member 27, a conical or pyramidal recess portion can be formed on a part corresponding to a location right above the light emitting element 25 so that light coming out of the light emitting element 25 is scattered sidewise right above the light emitting element 25. In another case, a convex, such as a hemispherical lens and Fresnel lens, can be formed on the part corresponding to the location right above the light emitting element 25 so that light coming out of the light emitting element 25 is condensed right above the light emitting element 25.

As a material making up the light guide member 27, a thermoplastic resin material, such as acryl, polycarbonate, cyclic polyolefin, polyethylene terephthalate, and polyester, a thermosetting resin material, such as epoxy and silicone, or an optically transparent material, such as glass, can be used. The thermoplastic resin material is particularly preferable because it can be manufactured efficiently by injection molding. Among thermoplastic resin materials, polycarbonate is preferred most because of its high transparency and inexpensiveness. The light guide member 27 can be formed, for example, by injecting molding or transfer molding. The light guide member 27 can be of a monolayer structure or of a laminated structure composed of a plurality of light-transmissive layers.

Each bonding member 29 is a member that fixes the light-extracting surface of the light emitting element 25 to the light-transmissive member 26. It is preferable that the bonding member 29 be a member that guides light from the light emitting element 25 to the light-transmissive member 26. Examples of the base material of the bonding member 29 include a silicone resin, an epoxy resin, a phenol resin, a polycarbonate resin, an acrylic resin, and a modified resin created by modifying any one of these resins. Using the epoxy resin as the material of the bonding member 29 is preferable because it improves the hardness of the plane light-emitter 20 to make it harder than a case of using the silicone resin. The silicone resin and modified silicone resin are preferable because of their superior heat resistance and light resistance. The bonding member 29 can contain the same fluorescent material as the fluorescent material making up the light-transmissive member 26.

The base substrate 31 has a plurality of the through-holes 35 (two through-holes 35 in FIG. 1) which are filled with the filler 50. The base substrate 31 is the body of the substrate 30, and is made of an insulating material having flexibility. For example, polyimide is used preferably as a material making up the base substrate 31. A reinforced plastic molding compound (e.g., glass epoxy, prepreg, or the like) made by impregnating a fibered reinforcing material, such as glass cloth and carbon fiber, with a resin is also used preferably as the material of the base substrate 31. Further, a resin film made of polyethylene terephthalate (PET), polyethylene naphthalate, polyether imide, polyphenylene sulfide, liquid crystal polymer, or the like can also be used. The base substrate 31 is, for example, about 10 µm to 40 µm in thickness.

The conductors 32 are, for example, electrically conductive foils formed on the base substrate 31. The conductors 32 are formed into given wiring patterns in a plan view and are electrically connected to the plurality of light emitting elements 25 to form an electric circuit. A plurality of the conductors 32 (two conductors 32 in FIG. 1) are formed such that through-holes to be filled with the filler 50 communicate with the through-holes 35 of the base substrate 31. It is preferable that a material making up each conductor 32 have high heat conductivity. Such an electrically conductive material as copper is an example of the above material. The conductor 32 can be formed by performing plating or applying or printing an electrically conductive paste. The conductor 32 is thinner than the base substrate 31, having a thickness of, for example, about 5 µm to 25 µm. Other materials that can be adopted as materials making up the conductor 32 include aluminum foil, aluminum alloy foil, and stainless steel foil.

The adhesive member 33 sticks the base substrate 31 to the plane light-emitter 20. The adhesive member 33 can be a double-faced adhesive tape, a hot-melt type adhesive sheet, or an adhesive liquid or an adhesive sheet made of a thermosetting resin or thermoplastic resin. In this embodiment, for example, the adhesive member 33 is provided as an acrylic double-faced adhesive tape. When the adhesive member 33 is a double-faced adhesive tape, through-holes communicating with the through-holes 35 of the base substrate 31 and with the through-holes of the conductors 32 are formed on the double-faced adhesive tape. The adhesive member 33 is equal in both length and width to the base substrate 31. The adhesive member 33 is thicker than the base substrate 31, having a thickness of, for example, about 50 µm. When the double-faced adhesive tape is a strip-like double-faced adhesive tape, a plurality of the adhesive members 33 can be arranged in the direction of their width at given intervals and stuck the base substrate 31 to the plane light-emitter 20.

The substrate 30 is, for example, about 20 µm to 100 µm in thickness. The through-holes 35 formed on the substrate 30 are, for example, each 500 µm to 600 µm in diameter.

The lighting device 10 is constructed by adhering the substrate 30 to the upper surface of the plane light-emitter 20 such that the terminals 21 of the plane light-emitter 20 are counter to the through-holes 35 of the substrate 30. When the substrate 30 and the plane light-emitter 20 are adhered together, the bottomed holes 41 are formed in the location of the through-holes 35. The second recess portion 28b and the third recess portion 28c of the terminals 21 communicate with the bottomed hole 41 and extend to a location outside the opening 42 of the bottomed hole 41 in a plan view.

The filler 50 is a member formed by injecting an electrically conductive paste into the bottomed hole 41 and curing the electrically conductive paste there. The filler 50 electrically connects the wiring line 22 of the plane light-emitter 20 to the conductor 32 of the substrate 30. The electrically conductive paste is made by dispersing a resin with an electrically conductive material in the form of nanoparticles or globular or scale-like grains with a grain diameter of several tens of µm or less. Using the electrically conductive paste made of a metal material with high heat conductivity, such as Ag and Cu, improves the heat dissipation of the lighting device 10.

Method of Manufacturing Lighting Device

Figure 4:
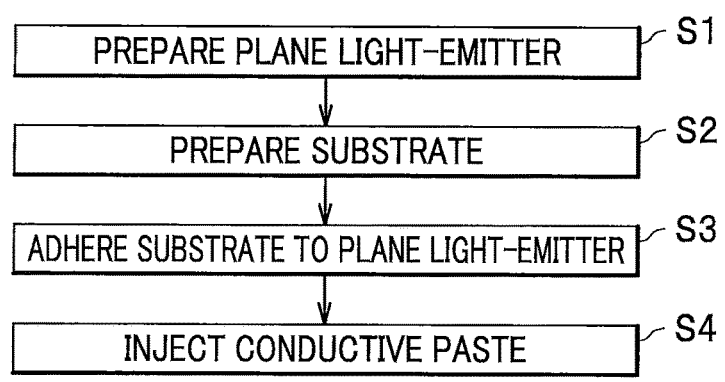
FIG. 4 is a flowchart illustrating steps making up a method of manufacturing the lighting device according to the first embodiment.
Figure 5:
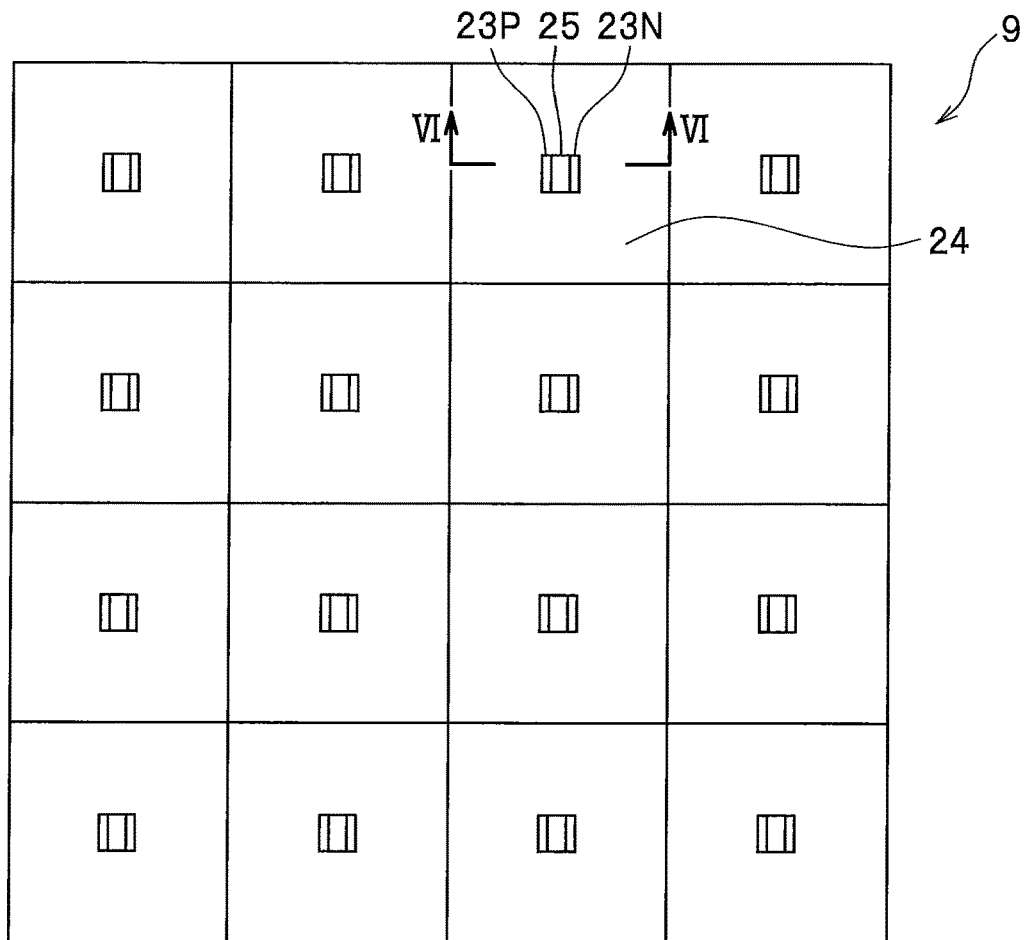
FIG. 5 is a schematic plan view diagrammatically illustrating a light-emitting element assembly prepared by the method of manufacturing the lighting device according to the first embodiment.
Figure 6:
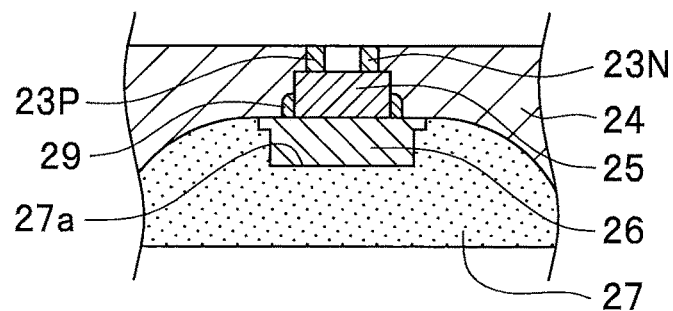
FIG. 6 is a cross-sectional view of the light-emitting element assembly of FIG. 5 that is taken along line VI-VI.
Figure 7:
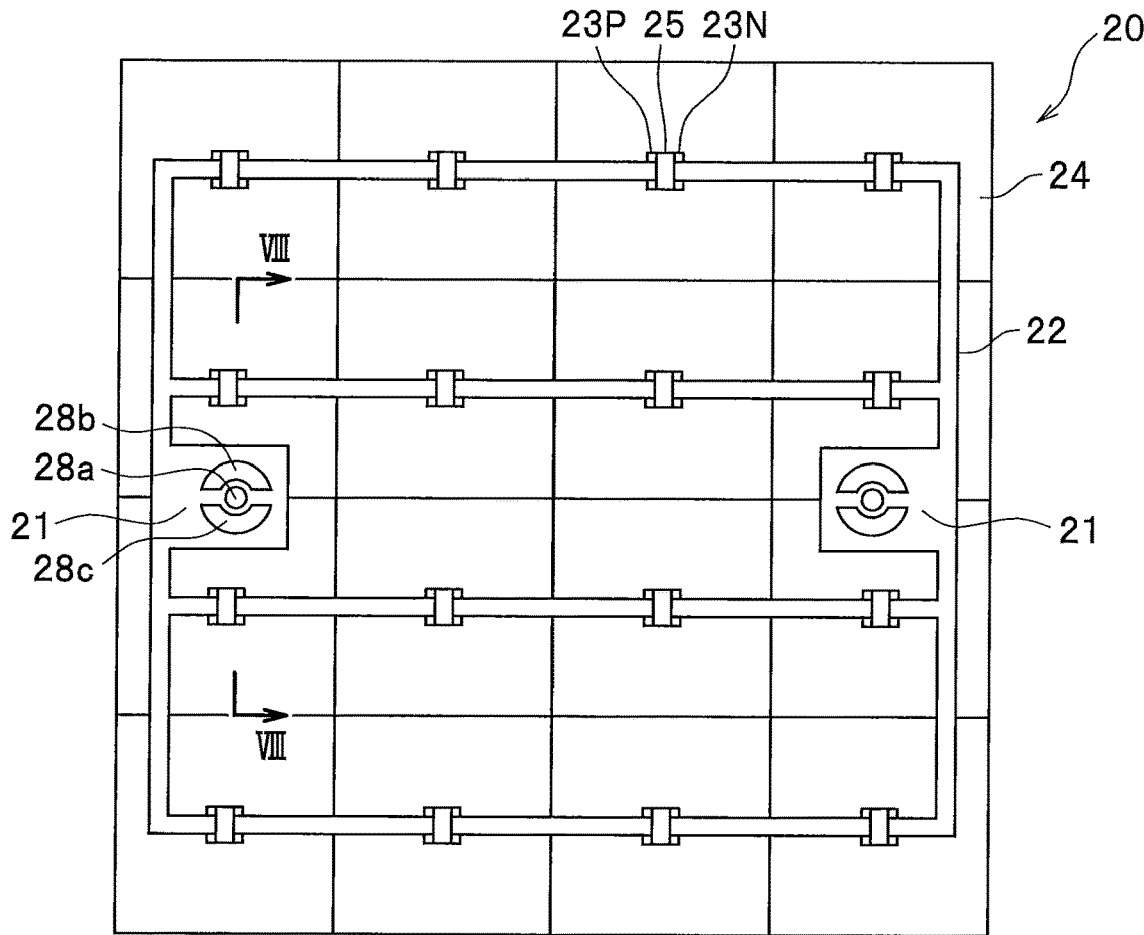
FIG. 7 is a schematic plan view diagrammatically illustrating a plane light-emitter on which wiring lines are formed by the method of manufacturing the lighting device according to the first embodiment.
Figure 8:
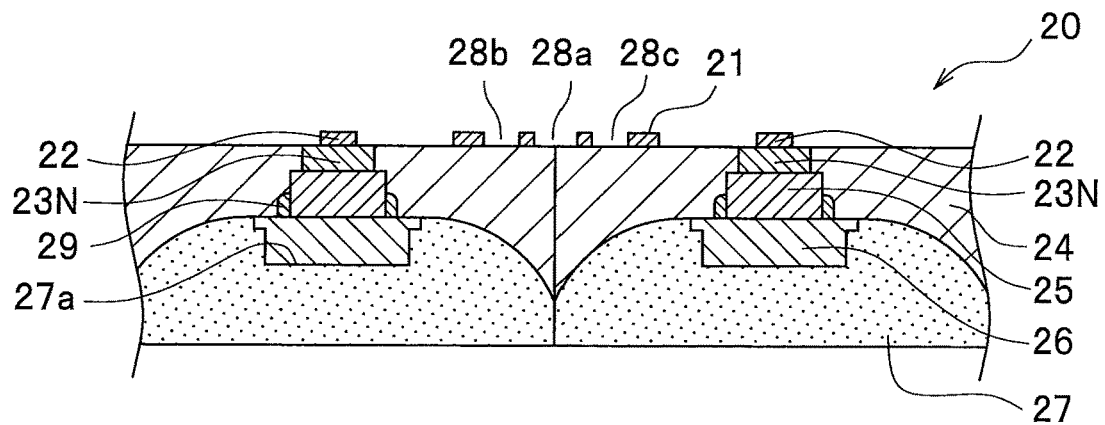
FIG. 8 is a cross-sectional view of the plane light-emitter of FIG. 7 that is taken along line VIII-VIII.
Figure 9:
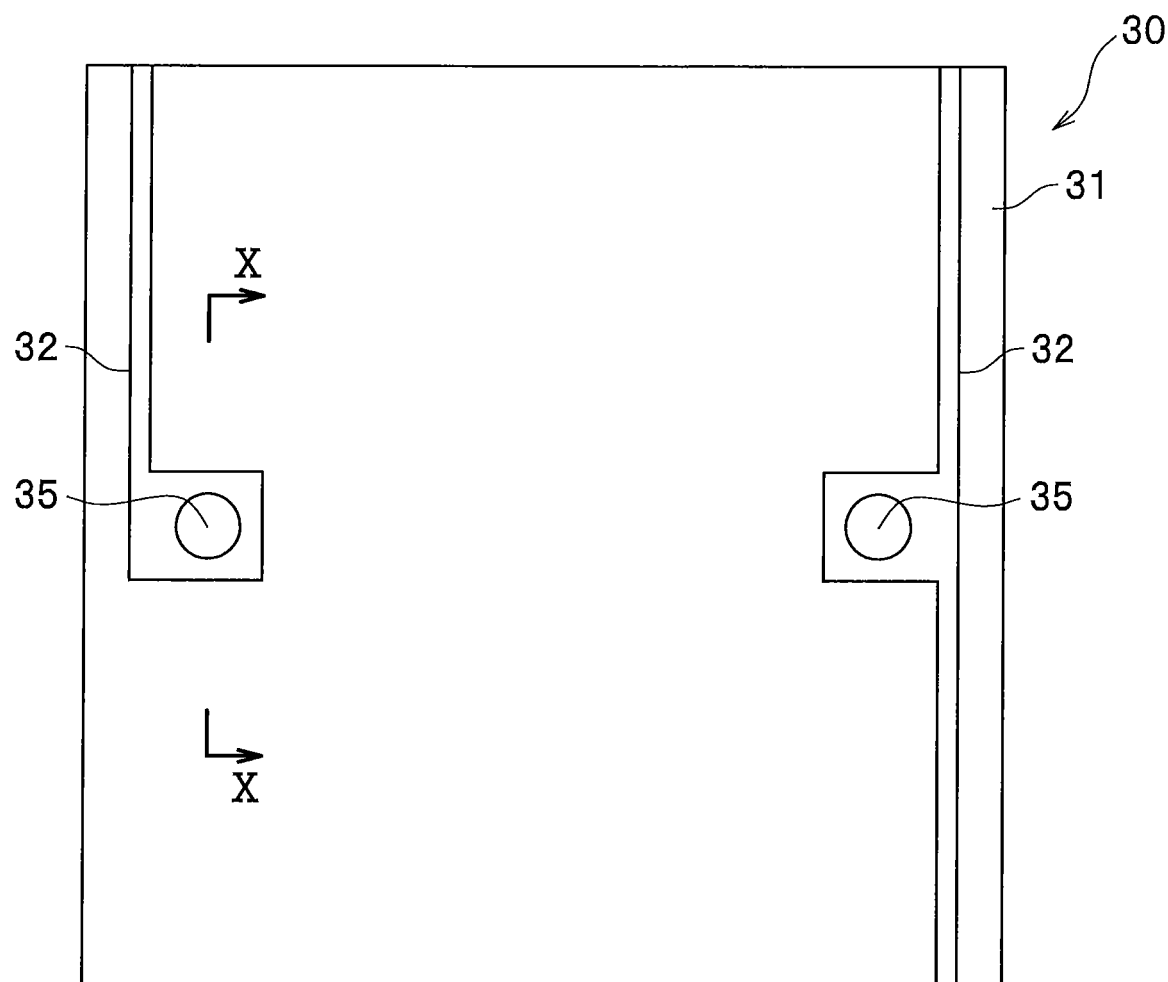
FIG. 9 is a schematic plan view diagrammatically illustrating a substrate on which through-holes are formed by the method of manufacturing the lighting device according to the first embodiment.
Figure 10:
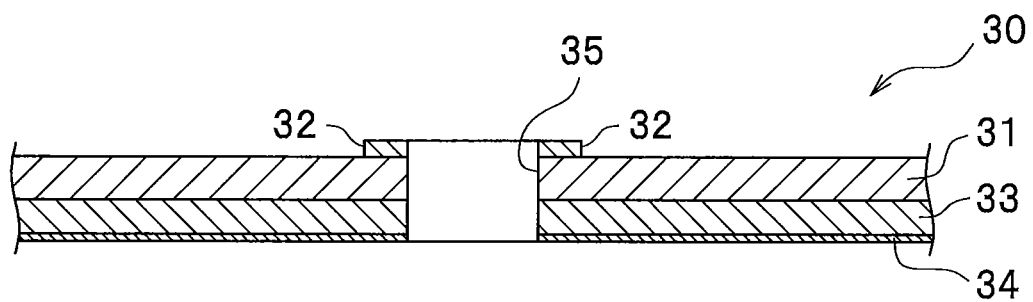
FIG. 10 is a cross-sectional view of the substrate of FIG. 9 that is taken along line X-X.
Figure 11:
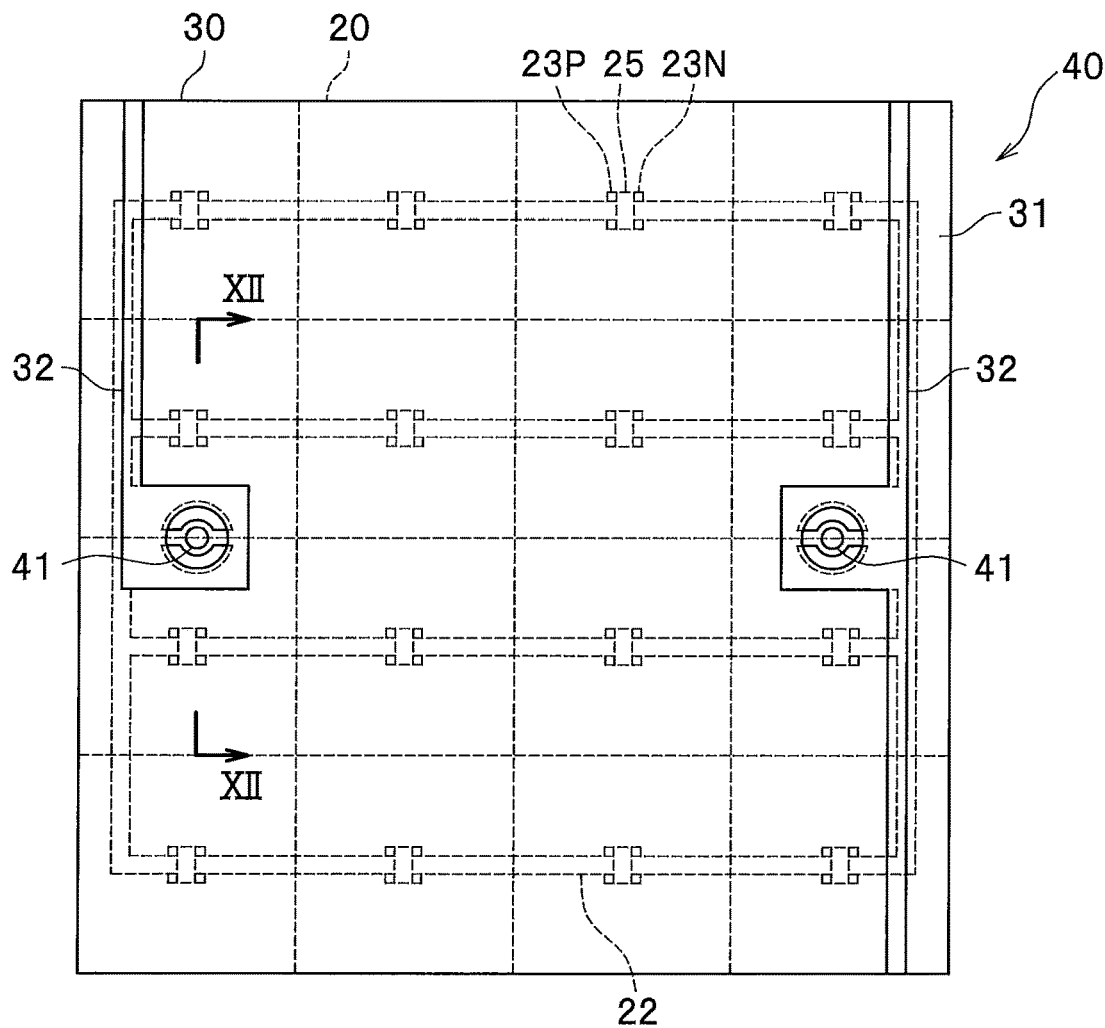
FIG. 11 is a schematic plan view diagrammatically illustrating an intermediate structure formed by an adhering step of the method of manufacturing the lighting device according to the first embodiment.
Figure 12:
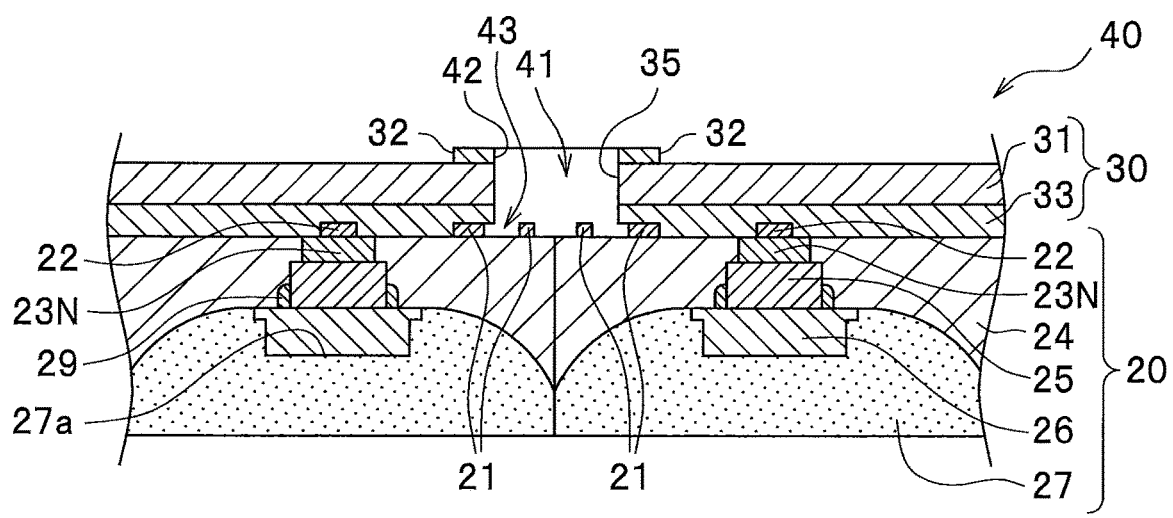
FIG. 12 is a cross-sectional view of the intermediate structure of FIG. 11 that is taken along line XII-XII.
Figure 13A:
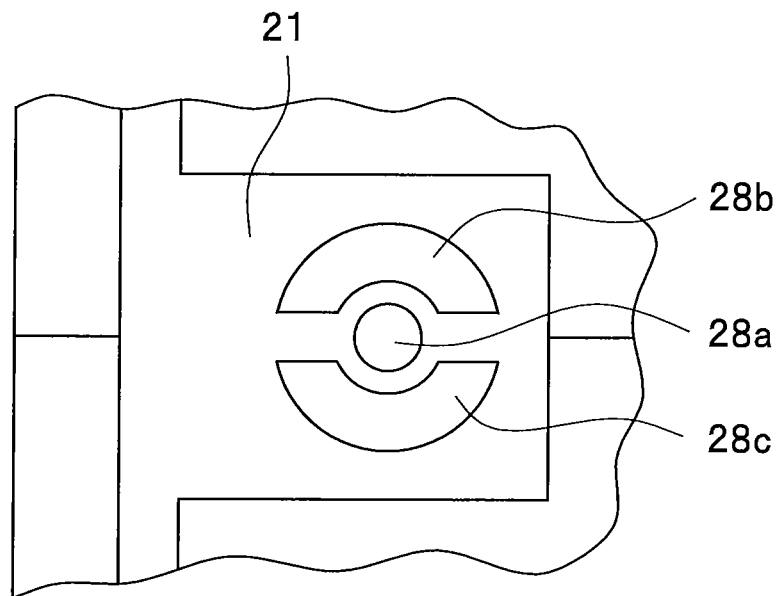
FIG. 13A is a schematic enlarged view of a terminal illustrated in FIG. 7.
Figure 13B:
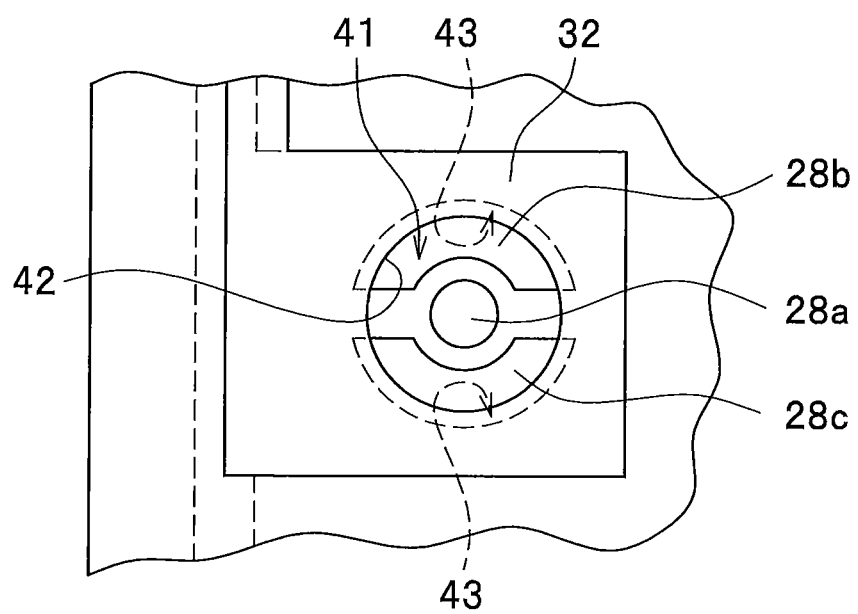
FIG. 13B is a schematic enlarged view of a bottomed hole illustrated in FIG. 11.

A method of manufacturing the lighting device 10 will then be described with reference to FIGS. 4 to 13B. FIG. 4 is a schematic flowchart illustrating steps making up a method of manufacturing the lighting device according to the first embodiment. FIG. 5 is a schematic plan view diagrammatically illustrating a light-emitting element assembly prepared by the method of manufacturing the lighting device according to the first embodiment. FIG. 6 is a cross-sectional view of the light-emitting element assembly of FIG. 5 that is taken along line VI-VI. FIG. 7 is a schematic plan view diagrammatically illustrating the plane light-emitter on which the wiring lines are formed by the method of manufacturing the lighting device according to the first embodiment. FIG. 8 is a cross-sectional view of the plane light-emitter of FIG. 7 that is taken along line VIII-VIII. FIG. 9 is a schematic plan view diagrammatically illustrating the substrate on which the through-holes are formed by the method of manufacturing the lighting device according to the first embodiment. FIG. 10 is a cross-sectional view of the substrate of FIG. 9 that is taken along line X-X. FIG. 11 is a schematic plan view diagrammatically illustrating an intermediate structure formed by an adhering step of the method of manufacturing the lighting device according to the first embodiment. FIG. 12 is a cross-sectional view of the intermediate structure of FIG. 11 that is taken along line XII-XII. FIG. 13A is a schematic enlarged view of the terminal illustrated in FIG. 7. FIG. 13B is a schematic enlarged view of the bottomed hole illustrated in FIG. 11. The method of manufacturing the lighting device 10 includes a plane light-emitter preparing step S1, a substrate preparing step S2, an adhering step S3, and an electrically conductive paste injecting step S4, which are carried out in the order of steps S1, S2, S3, and S4. Each of these steps will hereinafter be described.

The plane light-emitter preparing step S1 is a step of preparing the plane light-emitter 20 including the plurality of light emitting elements 25, and the support 24 having a first surface that carries the wiring lines 22 electrically connecting the element electrodes 23N and 23P of the plurality of light emitting elements 25 and the other surface that serves as the light emitting surface. The plane light-emitter 20 is manufactured by, for example, preparing a light-emitting element assembly 9 illustrated in FIGS. 5 and 6 and forming the wiring lines 22 on an electrode surface of the light-emitting element assembly 9. The light-emitting element assembly 9 has sixteen light emitting elements 25 arranged into a four by four matrix, the support 24 supporting the light emitting elements 25, the light-transmissive members 26, the light guide member 27, and the bonding members 29. The light-emitting element assembly 9 is different from the plane light-emitter 20 in that the light-emitting element assembly 9 has no wiring line 22. The light-emitting element assembly 9 manufactured in advance can be used.

To manufacture the light emitting element 25, for example, a sapphire substrate is used as a light-transmissive substrate, on which a semiconductor layer made of a nitride semiconductor including an active region of an InGaN-based substance is formed by metal organic chemical vapor deposition (MOCVD). On the semiconductor layer, for example, the positive and negative element electrodes 23P and 23N made of an Au/Ti alloy are formed. Through this process, a chip of the light emitting element 25 is manufactured.

To manufacture the light-emitting element assembly 9, the light guide member 27 having the plurality of fourth recess portions 27a is prepared first. The upper surface, i.e., second main surface of the light guide member 27 made of, for example, polycarbonate carries sixteen fourth recess portions 27a arranged into the four by four matrix. According to this embodiment, four light emitting elements 25 are connected in series to form a row, and four rows of these light emitting elements 25 are connected in parallel. However, depending on intended configuration, they can be arranged such that two light emitting elements 25 are connected in series to form a row and eight rows of these light emitting elements 25 are connected in parallel. In another case, every light emitting element 25 can be connected to another one independently.

Subsequently, a resin layer containing a fluorescent material is filled into the fourth recess portions 27a of the light guide member 27 by, for example, screen printing, potting, or the like. The resin layer is cured in the fourth recess portions 27a to form the light-transmissive members 26. A sheet of the light-transmissive member 26 can be prepared, in which case pieces of the light-transmissive member 26 each cut out from the sheet into a proper size are placed in the fourth recess portions 27a of the light guide member 27, respectively.

Subsequently, each light-transmissive member 26 has its upper surface coated with the material of the bonding member, such as a liquid silicone resin, and the chip of the light emitting element 25 is bonded to the material of the bonding member from above. As a result, the bonding member 29 is disposed on the upper surface of the light-transmissive member 26 and on the side surfaces of the light emitting element 25, thus fixing the light emitting element 25 to the upper surface of the light-transmissive member 26.

Subsequently, the light guide member 27 is overlaid with the material of the support by, for example, transfer molding such that the material of the support covers the light emitting element 25. A part of the material of the support is then ground to expose the element electrodes 23N and 23P of the light emitting element 25, thereby forming the support 24. The support 24 covers the side surfaces of the light emitting element 25, of the light-transmissive member 26, and of the bonding member 29. Through the above procedure, the light-emitting element assembly 9 can be manufactured.

To form the wiring lines 22 on the electrode surface of the light-emitting element assembly 9, for example, known methods, such as sputtering, vapor deposition, atomic layer deposition (ALD), and plating, can be used. As a wiring material, metal layers, such as Cu, Ni, and Au layers or Ni, Ru, and Au layers that are stacked in increasing order, are formed substantially on the whole surface of the element electrodes 23N and 23P of the light emitting elements 25 and that of the support 24, by sputtering or the like. Subsequently, the wiring material is patterned by, for example, thick film printing or laser ablation, to form the wiring lines 22. Through this process, as illustrated in FIGS. 7 and 8, the terminal 21 on a P-side (left side in FIG. 7) and the terminal 21 on an N-side (right side in FIG. 7) are formed as well. In a plan view, the terminals 21 are each larger in width than the wiring line and are larger in plane shape than the light emitting element 25. Each terminal 21 is formed such that it has the first recess portion 28a, the second recess portion 28b, and the third recess portion 28c. The plane light-emitter 20 is manufactured in this manner.

In this embodiment, the plane light-emitter 20 has 2 terminals 21 for sixteen light emitting elements 25. However, when the maximum number of terminals 21 are arranged, 2 terminals 21 can be provided for each light emitting element 25. The terminals 21 are disposed in the locations counter to the through-holes 35 of the substrate 30 (which will be described later on) such that the number of the terminals 21 is equal to the number of the through-holes 35.

As illustrated in FIGS. 9 and 10, the substrate preparing step S2 is a step of preparing the substrate having the film-like base substrate 31, the conductors 32 formed on a part of a first surface of the base substrate 31, the adhesive member 33 formed on the other surface of the base substrate 31, and the through-holes 35 penetrating the substrate in its thickness direction. The adhesive member 33 is, for example, a double-faced adhesive tape. The adhesive member 33 has one adhesive surface stuck to the base substrate 31, and the other adhesive surface covered with a peelable film 34.

Alternately, the substrate preparing step S2 can have a step of preparing a wiring substrate having the base substrate 31 on which the conductors 32 are formed, a step of adhering one adhesive surface of the adhesive member 33 to the base substrate 31, and a step of forming the through-holes 35.

The through-holes 35 are formed in the locations counter respectively to the terminals 21 of the plane light-emitter 20 such that the number of the through-holes 35 is equal to that of the terminals 21. The through-holes 35 are faulted by drilling and can be formed also by, for example, punching or laser emission. Each through-hole 35 is, for example, circular in plane shape. The through-hole 35 is, for example, about 500 μm to 600 μm in diameter. The substrate 30 is, for example, 100 μm in thickness. When punching or laser emission is adopted to form the through-hole 35, the shape of the through-hole 35 is not limited to a circular shape but can be an ellipse, a polygonal shape, such as rectangle, a dumbbell shape, or a star shape.

The adhering step S3 is a step of adhering the adhesive surface of the adhesive member 33 of the substrate 30 to the surface of the plane light-emitter 20 on which the wiring lines 22 are formed. At this step, the peelable film 34 is peeled off the substrate 30 to expose the adhesive surface of the adhesive member 33, and the adhesive surface of the adhesive member 33 is pressure-bonded to the surface of the plane light-emitter 20 on which the wiring lines 22 are formed. At this time, the substrate 30 and the plane light-emitter 20 are aligned to set the terminals 21 of the plane light-emitter 20 counter to the through-holes 35 of the substrate 30, and then are bonded together.

By this adhering step, an intermediate structure 40 illustrated in FIGS. 11 and 12 is formed. The intermediate structure 40 has the substrate 30 and the plane light-emitter 20. The intermediate structure 40 has the spaces 43 formed between the substrate 30 and the plane light-emitter 20, the spaces 43 communicating with the bottomed holes 41 formed in the location of the through-holes 35. As illustrated in FIGS. 13A and 13B, each space 43 of the intermediate structure 40 is located outside the opening 42 of the bottomed hole 41 in a plan view. The second recess portion 28b and the third recess portion 28c of the terminal 21 communicate with the bottomed hole 41 and extend to a location outside the opening 42 of the bottomed hole 41 in a plan view.

The electrically conductive paste injecting step S4 is a step of injecting the electrically conductive paste into the bottomed holes 41 of the intermediate structure 40. At this step, the wiring lines 22 are electrically connected to the conductors 32 via the filler 50 that is the electrically conductive paste having been injected into the bottomed holes 41 and cured there (see FIGS. 1 and 2). When the electrically conductive paste is injected into each bottomed hole 41 by a method properly selected from, for example, the screen printing method, a method using a dispenser, and an ink jetting method, the electrically conductive paste comes in contact with the terminal 21 making up the bottom surface of the bottomed hole 41. At this time, the electrically conductive paste coming in contact with the upper surface of the lead of the terminal 21 spreads further by a capillary phenomenon to enter the first recess portion 28a, the second recess portion 28b, and the third recess portion 28c. As a result, the electrically conductive paste is filled smoothly into the bottomed hole 41 to reach respective bottom surfaces and inner peripheral surfaces of the first recess portion 28a, the second recess portion 28b, and the third recess portion 28c. A part of the second recess portion 28b and the third recess portion 28c forms the space 43. Because the bottomed hole 41 communicates with the space 43 formed between the plane light-emitter 20 and the substrate 30, the electrically conductive paste is filled into the space 43 by the capillary phenomenon. In a plan view, the space 43 extend to a location outside the opening 42 of the bottomed hole 41. This structure allows the electrically conductive paste to proceed deeper to an inner part of the bottomed hole 41 beyond a space beneath the opening 42. As a result, the electrically conductive paste spreads smoothly to the bottom surface of the bottomed hole 41.

The electrically conductive paste can catch air when it is injected into the bottomed hole 41. In such a case, in the space beneath the opening 42, the space 43 can serve as an air pocket into which air escapes as the electrically conductive paste comes in contact with the terminal 21.

Afterward, the electrically conductive paste filled into the bottomed hole 41 is cured by heat to form the filler 50, which electrically connects the wiring line 22 of the plane light-emitter 20 to the conductor 32 of the substrate 30. By the above steps, a final structure of the lighting device 10 illustrated in FIGS. 1-2 can be manufactured. This manufacturing method increases a contact area between the electrically conductive paste and the lead of the terminal 21.

According to the method of manufacturing the lighting device of the embodiment, when the electrically conductive paste is injected into the bottomed hole 41, a contact area between the electrically conductive paste and the wiring line of the plane light-emitter 20 increases due to the presence of the space 43, resulting in an increased degree of adhesion between the electrically conductive paste and the wiring line. Hence, the lighting device with improved connection reliability can be manufactured.

Figure 14:
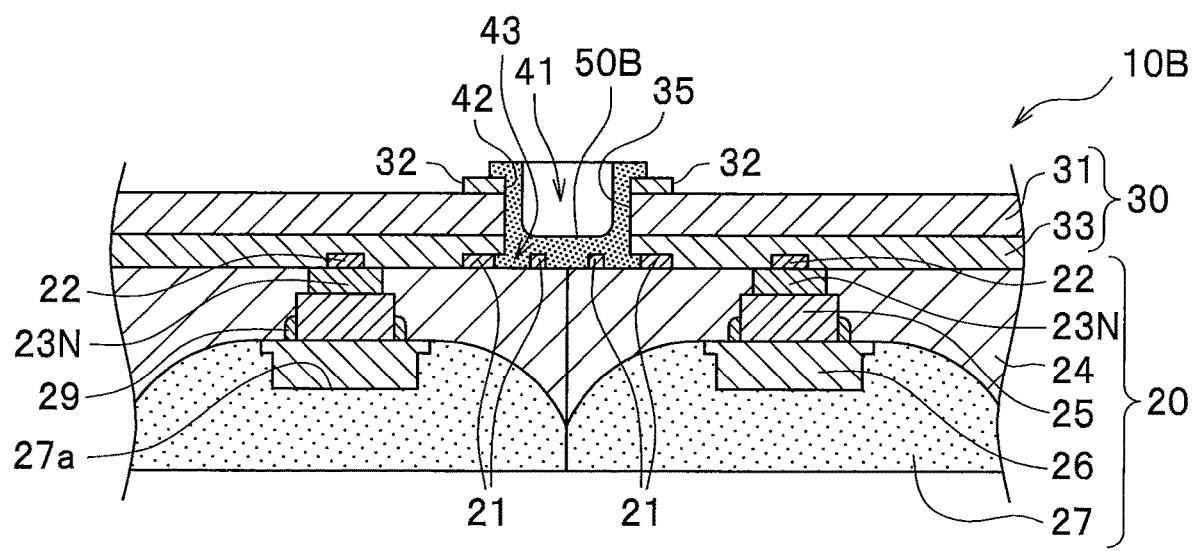
FIG. 14 is a cross-sectional view diagrammatically illustrating a modification of the lighting device according to the first embodiment.

In the lighting device of the first embodiment, a recess portion can be formed on the filler, as illustrated in FIG. 14. FIG. 14 is a cross-sectional view diagrammatically illustrating a modification of the lighting device manufactured by the method of manufacturing the lighting device according to the first embodiment. A lighting device 10B is different from the lighting device 10 in that the cross-sectional shape of a filler 50B of the lighting device 10B is different from that of the filler 50 of the lighting device 10. Following the curing of the electrically conductive paste, the center of an upper surface of the filler 50B can sink in, depending on a material making up the electrically conductive paste filling the bottomed hole 41, to become lower than the upper surface of the substrate 30. Even in such a case, because of the presence of the first recess portion 28a, the second recess portion 28b, and the third recess portion 28c, the lighting device with improved connection reliability can be manufactured.

Level differences can be formed by the following methods to form the first recess portion 28a, the second recess portion 28b, and the third recess portion 28c. For example, on the upper surface of the support 24, the upper surface serving as the bottom surfaces of the first recess portion 28a, the second recess portion 28b, and the third recess portion 28c, a recess portion of about 30 μm in depth can be formed in advance. In this case, these recess portions are made deeper. In this case, the thickness of the wiring line 22 can be reduced to, for example, about 500 angstroms (0.05 μm), and therefore the overall thickness of the plane light-emitter can be reduced as well. In another case, for example, when the wiring line 22 is formed, the thickness of the part of terminal 21 that is other than the bottom surfaces of the first, second, and third recess portions 28a, 28b, and 28c can be made larger by about 30 μm than the thickness of the part of terminal 21 that make up the bottom surfaces so that the bottom surfaces of the first, second, and third recess portions are flush with the upper surface of the wiring line 22.

Second Embodiment

Figure 15:
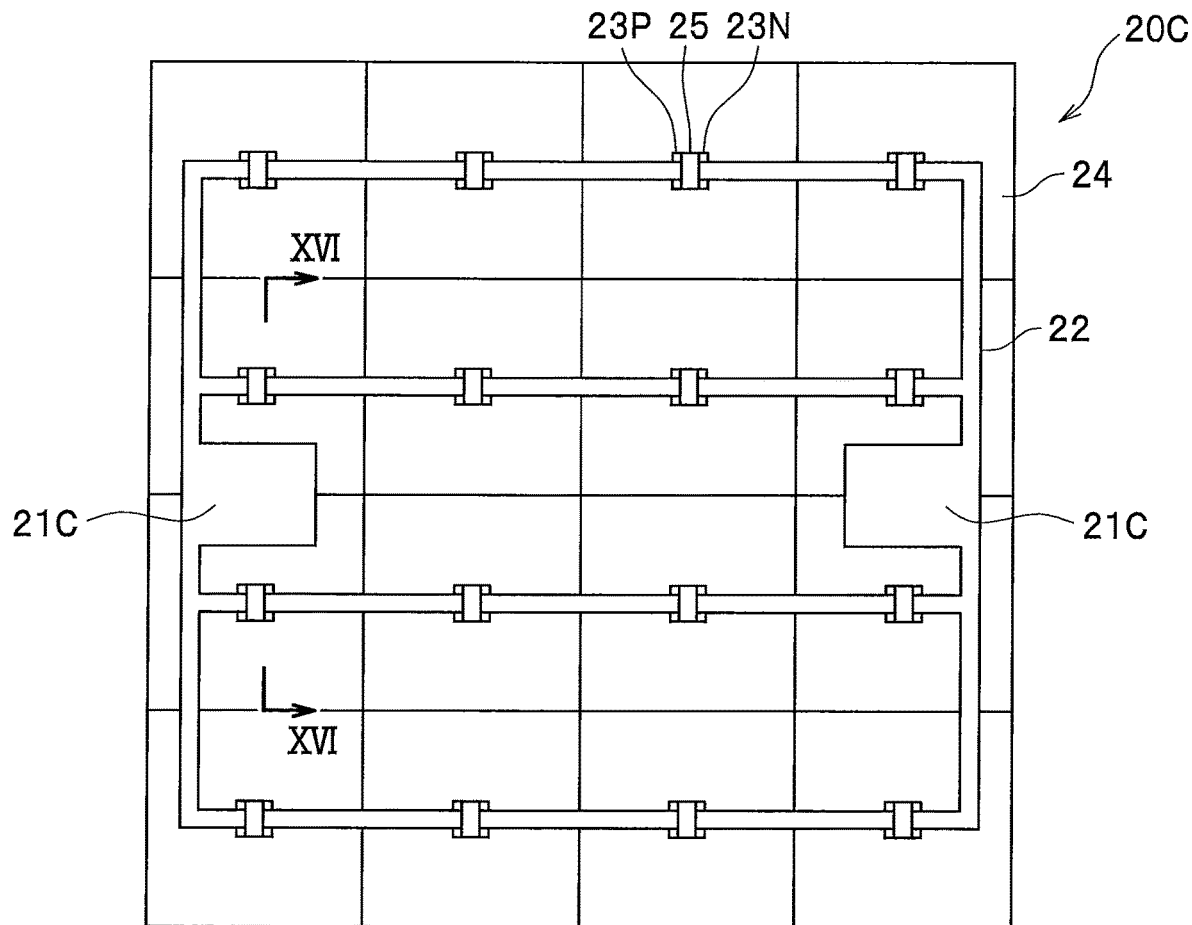
FIG. 15 is a schematic plan view diagrammatically illustrating a plane light-emitter on which the wiring lines are formed by a method of manufacturing a lighting device according to a second embodiment.
Figure 16:
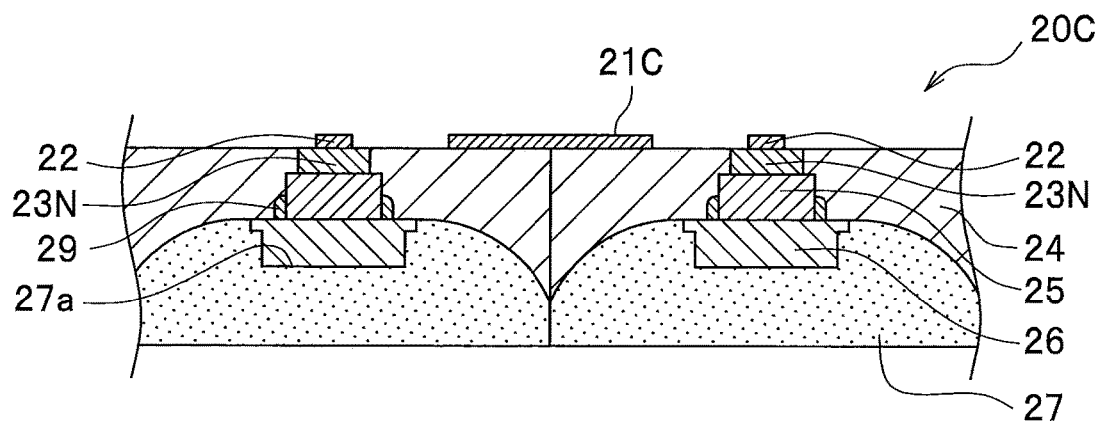
FIG. 16 is a cross-sectional view of the plane light-emitter of FIG. 15 that is taken along line XVI-XVI.
Figure 17:
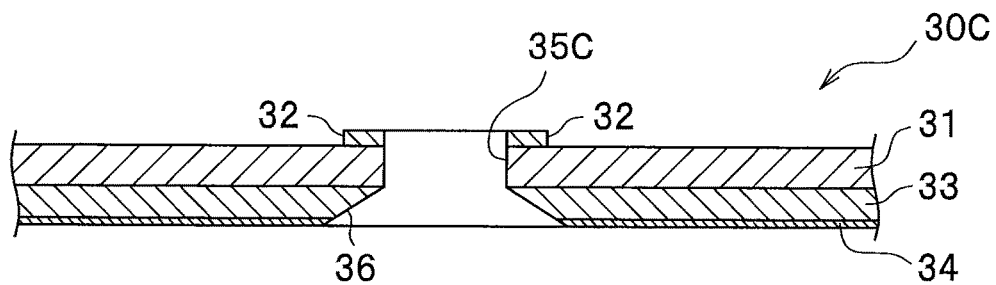
FIG. 17 is a cross-sectional view diagrammatically illustrating a substrate on which a through-hole is formed by the method of manufacturing the lighting device according to the second embodiment.
Figure 18:
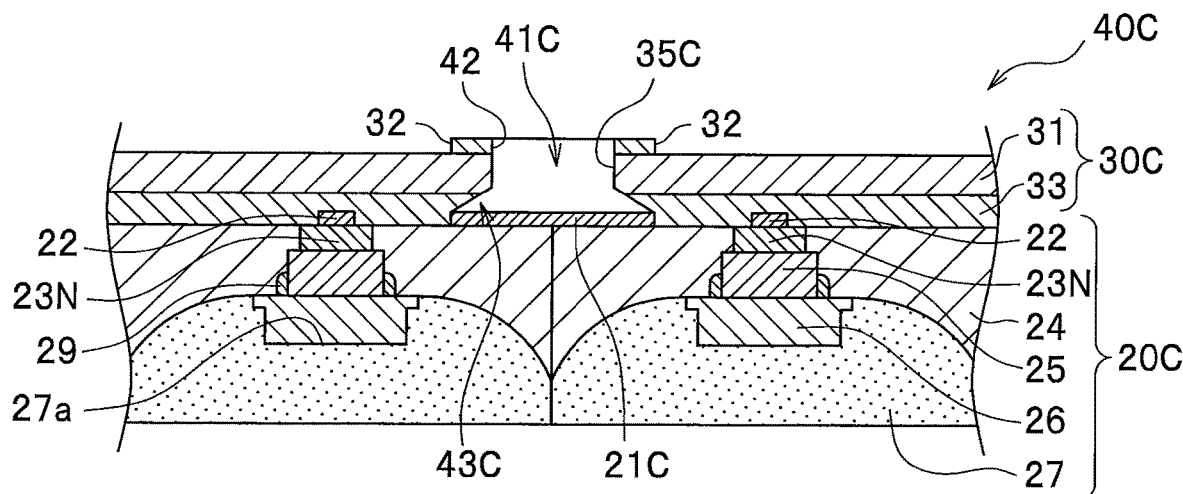
FIG. 18 is a cross-sectional view diagrammatically illustrating an intermediate structure formed by the adhering step of the method of manufacturing the lighting device according to the second embodiment.
Figure 19:
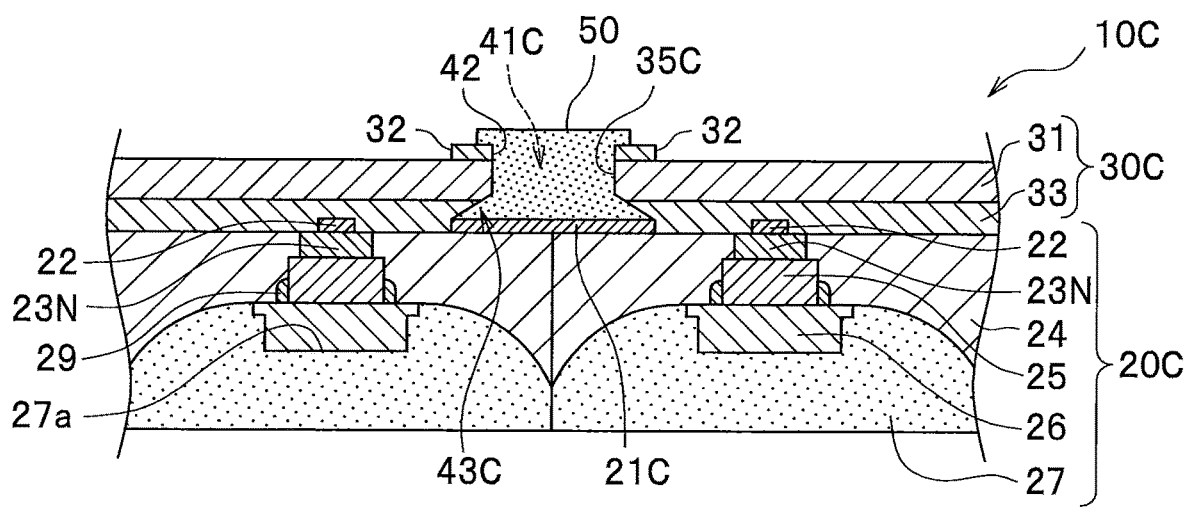
FIG. 19 is a cross-sectional view diagrammatically illustrating a lighting device manufactured by the method of manufacturing the lighting device according to the second embodiment.

A lighting device according to a second embodiment will now be described. FIG. 15 is a schematic plan view diagrammatically illustrating the plane light-emitter on which the wiring lines are formed by a method of manufacturing a lighting device according to a second embodiment. FIG. 16 is a cross-sectional view of the plane light-emitter of FIG. 15 that is taken along line XVI-XVI. FIG. 17 is a cross-sectional view diagrammatically illustrating the substrate on which the through-holes are formed by the method of manufacturing the lighting device according to the second embodiment. FIG. 18 is a cross-sectional view diagrammatically illustrating an intermediate structure formed by the adhering step of the method of manufacturing the lighting device according to the second embodiment. FIG. 19 is a cross-sectional view diagrammatically illustrating a lighting device manufactured by the method of manufacturing the lighting device according to the second embodiment.

In the following description, the same constituent elements as described in the first embodiment will be denoted by the same reference marks and will be omitted in further description.

The method of manufacturing the lighting device according to the second embodiment is the same as the method described above, and therefore description of the method will be omitted unless needed to describe the differences between the second embodiment and the first embodiment. At the plane light-emitter preparing step S1, a plane light-emitter 20C illustrated in FIG. 15 is prepared. The plane light-emitter 20C is different from the plane light-emitter 20 illustrated in FIG. 7 in that the shape of terminals 21C connected to the wiring lines 22 are different from the shape of the terminals of the plane light-emitter 20. Each terminal 21C has no recess portion and is formed into a flat shape substantially uniform in thickness. The plane light-emitter 20C can be manufactured by forming the wiring lines 22, which are arranged into a pattern illustrated in FIG. 15, on the electrode surface of the light-emitting element assembly 9 illustrated in FIG. 5.

At the substrate preparing step S2, a substrate 30C illustrated in FIG. 17 is prepared. The substrate 30C is different from the substrate 30 illustrated in FIG. 10 in that the sectional shape of a through-hole 35C is different from that of the through-hole of the substrate 30. The through-hole 35C is formed as a through-hole punched in the substrate 30C to penetrate it from the surface carrying the conductor 32 to the adhesive surface. As a result, the through-hole 35C formed on the substrate 30C is larger in width at the adhesive surface than at the surface carrying the conductor 32. Specifically, the through-hole 35C has an opening formed on the side where the adhesive member 33 is located and an opening formed on the side where the conductor 32 is located, and the former opening is wider than the latter one. In the through-hole 35C, an inner peripheral surface 36 near the opening formed on the adhesive member 33 side is a tapered surface that widens as it approaches the opening formed on the adhesive member 33 side.

At the adhering step S3, the peelable film 34 is peeled off the substrate 30C to expose the adhesive surface of the adhesive member 33, and the adhesive surface of the adhesive member 33 is pressure-bonded to the surface of the plane light-emitter 20C on which the wiring lines 22 are formed. At this time, the substrate 30C and the plane light-emitter 20C are aligned to set the terminals 21 of the plane light-emitter 20C counter to the through-holes 35C of the substrate 30C, and then are bonded together. By this adhering step, an intermediate structure 40C illustrated in FIG. 18 is formed. The intermediate structure 40C has the substrate 30C and the plane light-emitter 20C. The intermediate structure 40C has spaces 43C formed between the substrate 30C and the plane light-emitter 20C, the spaces 43C communicating with bottomed holes 41C formed in the location of the through-holes 35C. Each space 43C is located outside the opening 42 of the bottomed hole 41C in a plan view. The space 43C is formed between the inner peripheral surface 36 of the through-hole 35C of the substrate 30C and the surface of the plane light-emitter 20C on which the wiring lines 22 are formed.

At the electrically conductive paste injecting step S4, the wiring lines 22 are electrically connected to the conductors 32 via the filler 50 that is the electrically conductive paste having been injected into bottomed holes 41C of the intermediate structure 40C and cured there (see FIG. 19). When the electrically conductive paste is injected into each bottomed hole 41C by, for example, screen printing, the electrically conductive paste comes in contact with the terminal 21C making up the bottom surface of the bottomed hole 41C. Because the bottomed hole 41C communicates with the space 43C formed between the inner peripheral surface 36 of the through-hole 35C of the substrate 30C and the surface of the plane light-emitter 20C on which the wiring lines 22 are formed, the electrically conductive paste spreads to fill the space 43C. In a plan view, the space 43C extend to a location outside the opening 42 of the bottomed hole 41C. This structure allows the electrically conductive paste to proceed deeper to an inner part of the bottomed hole 41C beyond a space beneath the opening 42. The electrically conductive paste is, therefore, filled smoothly into the bottomed hole 41C. The electrically conductive paste can catch air when it is injected into the bottomed hole 41C. In such a case, in the space beneath the opening 42, the space 43 can serve as a path through which air escapes as the electrically conductive paste comes in contact with the terminal 21C.

Afterward, the electrically conductive paste filling the bottomed hole 41C is cured by heat to form the filler 50, which electrically connects the wiring line 22 of the plane light-emitter 20C to the conductor 32 of the substrate 30C. By the above steps, the lighting device 10C illustrated in FIG. 19 is manufactured. By this manufacturing method, a contact area between the electrically conductive paste and the lead of the terminal 21C increases in the lighting device 10C.

The lighting device 10C can be manufactured in such a way that in the intermediate structure 40C, the plane light-emitter 20C is replaced with the plane light-emitter 20 of FIG. 8, which is adhered to the substrate 30C, and then the electrically conductive paste is injected.

The lighting device according to the present invention has been described specifically in DESCRIPTION OF THE EMBODIMENTS. The substance of the present invention, however, is not limited to the above description but must be interpreted broadly based on what is claimed. Obviously, various modifications and variations of the invention that are achieved based on the above description are also included in the scope of the present invention.

What is claimed is:

1. A method of manufacturing a lighting device, the method comprising:
   preparing a plane light-emitter including a plurality of light emitting elements, and a support having a first surface that carries a wiring line electrically connecting element electrodes of the plurality of light emitting elements and a second surface that serves as a light emitting surface;
   preparing a substrate including a base substrate having a film shape, a conductor formed on a part of a first surface of the base substrate, an adhesive member formed on a second surface of the base substrate, and a through-hole penetrating the substrate in a thickness direction of the substrate;
   forming an intermediate structure having a space between the substrate and the plane light-emitter, the space being formed in such a way as to communicate with a bottomed hole formed in a location of the through-hole as a result of adhering an adhesive surface of the adhesive member of the substrate to a surface of the plane light-emitter having the wiring line formed thereon; and
   connecting the wiring line to the conductor via a filler on the intermediate structure, the filler being formed by injecting an electrically conductive paste into the bottomed hole and curing the electrically conductive paste, wherein
   the space of the intermediate structure is located outside an opening of the bottomed hole in a plan view.

2. The method of manufacturing a lighting device according to claim 1, wherein
   the through-hole is formed as a through-hole punched in the substrate to penetrate the substrate from a surface carrying the conductor to the adhesive surface, and
   the space of the intermediate structure is formed between an inner peripheral surface of the through-hole of the substrate and a surface of the plane light-emitter having the wiring line formed thereon.

3. The method of manufacturing the lighting device according to claim 1, wherein
   the plane light-emitter includes a terminal electrically connected to the wiring line,
   the terminal includes a recess portion,
   the intermediate structure is formed by adhering the substrate to an upper surface of the plane light-emitter such that the terminal of the plane light-emitter is set counter to the through-hole of the substrate, and
   on the intermediate structure, the recess portion of the terminal extends to a location outside an opening of the bottomed hole in a plan view, the recess portion communicating with the bottomed hole.

4. A lighting device comprising:

a plane light-emitter including a plurality of light emitting elements, and a support having a first surface that carries a wiring line electrically connecting element electrodes of the plurality of light emitting elements and a second surface that serves as a light emitting surface; and a substrate including a base substrate having a film shape, a conductor formed on a part of a first surface of the base substrate, an adhesive member formed on a second surface of the base substrate, and a through-hole penetrating the substrate in a thickness direction the substrate, wherein a space is formed between the substrate and the plane light-emitter in such a way as to communicate with a bottomed hole formed in a location of the through-hole as a result of adhering an adhesive surface of the adhesive member of the substrate to a surface of the plane light-emitter having the wiring line formed thereon, the wiring line is connected to the conductor via a filler filling the bottomed hole, and the space is located outside an opening of the bottomed hole in a plan view.

5. The lighting device according to claim 4, wherein the through-hole formed on the substrate is larger in width at an adhesive surface than at a surface carrying the conductor formed thereon, and the space is formed between an inner peripheral surface of the through-hole of the substrate and a surface of the plane light-emitter having the wiring lines formed thereon.

6. The lighting device according to claim 4, wherein the plane light-emitter includes a terminal electrically connected to the wiring line, the terminal includes a recess portion, the substrate is adhered to an upper surface of the plane light-emitter such that the terminal of the plane light-emitter is set counter to the through-hole of the substrate, and the recess portion of the terminal extends to a location outside an opening of the bottomed hole in a plan view, the recess portion communicating with the bottomed hole.

* * * * *